(12) United States Patent
Wang

(10) Patent No.: US 12,080,337 B2
(45) Date of Patent: Sep. 3, 2024

(54) LOCAL AMPLIFYING CIRCUIT, DATA READOUT METHOD AND MEMORY

(71) Applicant: CHANGXIN MEMORY TECHNOLOGIES, INC., Hefei (CN)

(72) Inventor: Ying Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 172 days.

(21) Appl. No.: 17/854,153

(22) Filed: Jun. 30, 2022

(65) Prior Publication Data

US 2023/0230632 A1    Jul. 20, 2023

Related U.S. Application Data

(63) Continuation of application No. PCT/CN2022/078106, filed on Feb. 25, 2022.

(30) Foreign Application Priority Data

Jan. 14, 2022  (CN) .......................... 202210044996.0

(51) Int. Cl.
    *G11C 7/12*   (2006.01)
    *G11C 7/06*   (2006.01)
    *G11C 11/4091*  (2006.01)
    *G11C 11/4094*  (2006.01)
    *G11C 11/4097*  (2006.01)

(52) U.S. Cl.
    CPC .......... *G11C 11/4091* (2013.01); *G11C 7/062* (2013.01); *G11C 7/12* (2013.01); *G11C 11/4094* (2013.01); *G11C 11/4097* (2013.01)

(58) Field of Classification Search
    CPC ....... G11C 11/4091; G11C 7/062; G11C 7/12; G11C 11/4094; G11C 11/4097
    See application file for complete search history.

(56) References Cited

U.S. PATENT DOCUMENTS

| 2002/0001215 A1* | 1/2002 | Fujisawa | G11C 5/063 365/51 |
| 2006/0013051 A1* | 1/2006 | Lee | G11C 7/18 365/205 |
| 2011/0103123 A1* | 5/2011 | Nakaoka | G11C 11/4074 365/63 |
| 2011/0116334 A1* | 5/2011 | Yu | G11C 7/18 365/203 |

(Continued)

*Primary Examiner* — Mushfique Siddique
(74) *Attorney, Agent, or Firm* — Kilpatrick Townsend & Stockton LLP

(57) ABSTRACT

A local amplifying circuit, a data readout method and a memory are provided. The local amplifying circuit includes: write control transistors, configured to connect a global data line to a local data line based on a write enable signal; column selection transistors, configured to connect a bit line to the local data line based on a column selection signal; a first control NMOS transistor, having a gate connected to the local data line, one of a source and a drain being connected to the global data line and the other being connected to a corresponding read control transistor; a second control NMOS transistor, having a gate connected to a complementary local data line, one of a source and a drain being connected to a complementary global data line and the other being connected to a corresponding read control transistor.

13 Claims, 3 Drawing Sheets

201

A local data line and a complementary local data line are precharged to a first preset level, and a global data line and a complementary global data line are precharged to a precharge level

202

A read enable signal and a column selection signal are provided, and a time of providing the read enable signal is no later than a time when a potential of the global data line or the complementary global data line changes based on the column selection signal

(56) References Cited

U.S. PATENT DOCUMENTS

| | | | |
|---|---|---|---|
| 2012/0008446 A1* | 1/2012 | Kim | G11C 11/4094 |
| | | | 365/203 |
| 2019/0304516 A1* | 10/2019 | Shimizu | G11C 29/52 |
| 2023/0230634 A1* | 7/2023 | Wang | G11C 11/4097 |
| | | | 365/189.14 |

* cited by examiner

LOCAL AMPLIFYING CIRCUIT, DATA READOUT METHOD AND MEMORY

CROSS-REFERENCE TO RELATED APPLICATIONS

This is a continuation application of International Patent Application No. PCT/CN2022/078106, filed on Feb. 25, 2022, which claims priority to Chinese patent application No. 202210044996.0, filed on Jan. 14, 2022. The contents of International Patent Application No. PCT/CN2022/078106 and Chinese patent application No. 202210044996.0 are hereby incorporated by reference in their entireties.

BACKGROUND

When a memory performs a data readout operation, data is transmitted from a bit line/complementary bit line to a local data line/complementary local data line in turn, and then to a global data line/complementary global data line. The transmission of data from the local data line/complementary local data line to the global data line/complementary global data line is implemented based on a local amplifying circuit.

When performing read operation, the local amplifying circuit is required to wait for the data to be transmitted from the bit line/complementary bit line to the local data line/complementary local data line, and then provides a read enable signal to further readout the data to the global data line/complementary global data line. If the read enable signal is provided when the data is not fully transmitted to the local data line/complementary local data line, the local data line/complementary local data line are both at a high level and may be discharged simultaneously, which results in a read error of the local amplifying circuit or unnecessary power consumption, and a time interval between a time of providing a column selection signal and a time of providing the read enable signal may affect the performance of the memory.

Therefore, it is urgent to design a readout circuit for the signal to shorten the time interval between the time of providing the column selection signal and the time of providing the read enable signal, so as to optimize the performance of the memory.

SUMMARY

The present disclosure relates to the field of semiconductor circuit design, and in particular, to a local amplifying circuit, a data readout method and a memory.

Embodiments of the present disclosure provide a local amplifying circuit, which includes write control transistors, column selection transistors, a first control N-channel metal oxide semiconductor (NMOS) transistor, a second control NMOS transistor, a precharge module and read control transistors. The write control transistors are configured to connect, based on a write enable signal, a global data line to a local data line and a complementary global data line to a complementary local data line. The column selection transistors are configured to connect, based on a column selection signal, a bit line to the local data line and a complementary bit line to the complementary local data line. The first control NMOS transistor has a gate connected to the local data line, one of a source and a drain of the first control NMOS transistor is connected to the global data line and the other is connected to a corresponding read control transistor. The second control NMOS transistor has a gate connected to the complementary local data line, one of a source and a drain of the second control NMOS transistor is connected to the complementary global data line and the other is connected to a corresponding read control transistor. The precharge module is connected to the local data line and the complementary local data line and configured to precharge the local data line and the complementary local data line to a first preset level, and the first preset level is less than a threshold voltage of the first control NMOS transistor and less than a threshold voltage of the second control NMOS transistor. The read control transistors are configured to pull up/down an end of the first control NMOS connected to the corresponding read control transistor and an end of the second control NMOS transistor connected to the corresponding read control transistor to a second preset level based on a read enable signal. The second preset level is opposite to a precharge level of the global data line and the complementary global data line.

The embodiments of the present disclosure also provide a memory, which is configured to write and readout data using the above local amplifying circuit.

BRIEF DESCRIPTION OF THE DRAWINGS

One or more embodiments are exemplified by the figures in the corresponding drawings, and these exemplary descriptions do not constitute limitations of the embodiments. Unless otherwise stated, the figures in the drawings do not constitute a scale limitation. In order to illustrate the technical solutions in the embodiments of the disclosure or conventional technologies more clearly, the drawings used in the embodiments will be briefly described below. It is apparent that the drawings in the following descriptions are merely some embodiments of the disclosure. Other drawings can be obtained from those skilled in the art according to these drawings without any creative work.

DETAILED DESCRIPTION

When a memory performs a data readout operation, data is transmitted from a bit line/complementary bit line to a local data line/complementary local data line in sequence, and then to a global data line/complementary global data line. The transmission of data from the local data line/complementary local data line to the global data line/complementary global data line is implemented based on a local amplifying circuit.

When performing read operation, the local amplifying circuit is required to wait for the data to be transmitted from the bit line/complementary bit line to the local data line/complementary local data line, and then provides a read enable signal to further readout the data to the global data line/complementary global data line. If the read enable signal is provided when the data is not fully transmitted to the local data line/complementary local data line, the local data line/complementary local data line are both at a high level and may be discharged simultaneously, which results in a read error of the local amplifying circuit or unnecessary power consumption, and a time interval between a time of providing a column selection signal and a time of providing the read enable signal may affect the performance of the memory.

The embodiments of the present disclosure provide a local amplifying circuit, capable of shortening the time interval between a time of providing the column selection signal and a time of providing the read enable signal during a data readout phase, to accelerate data readout of the memory.

It is to be understood by those of ordinary skill in the art that, in each embodiments of the present disclosure, many technical details are provided to better understand the disclosure. However, even without these technical details and various changes and modifications based on the following embodiments, the technical solutions claimed in the disclosure may also be realized. The following divisions of the embodiments are for ease of description, and should not constitute any limitation to the specific implementations of the disclosure. The embodiments may be combined with each other and referred to each other without contradiction.

Figure 1:
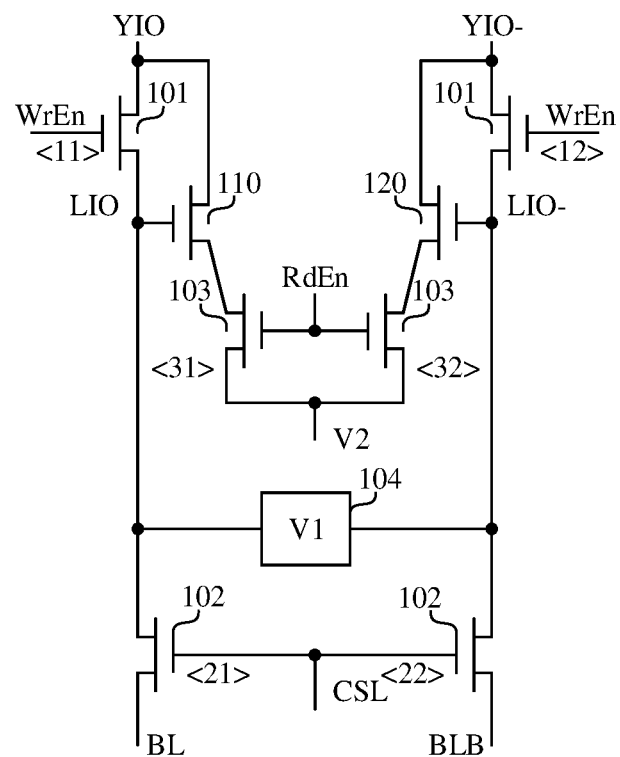
FIG. 1 is a schematic structural diagram of a local amplifying circuit according to an embodiment of the present disclosure.
Figure 2:
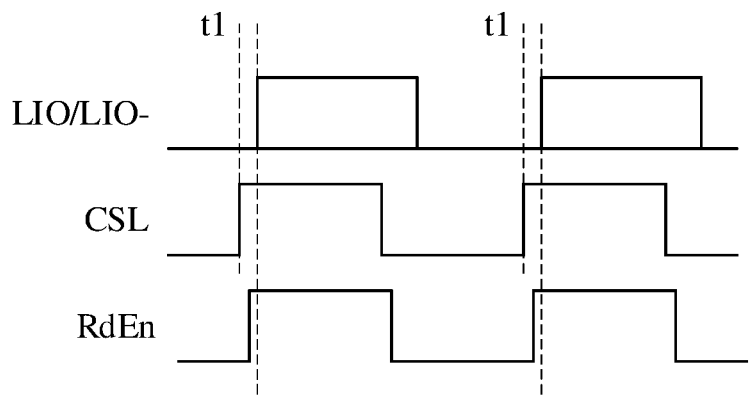
FIG. 2 is a schematic diagram of a timing sequence of providing a read enable signal and a column selection signal according to an embodiment of the present disclosure.
Figure 3:
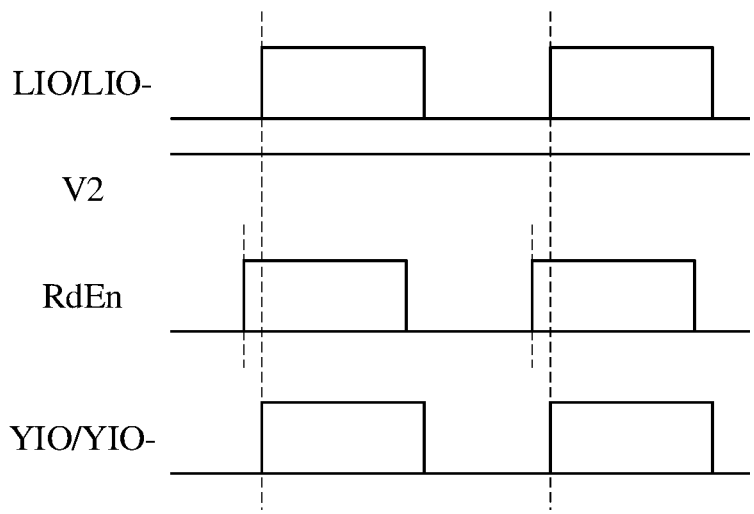
FIG. 3 is a schematic diagram of timing sequences of providing signals when data on a local data line/complementary local data is read out to a global data line/complementary global data line according to an embodiment of the present disclosure.
Figure 4:
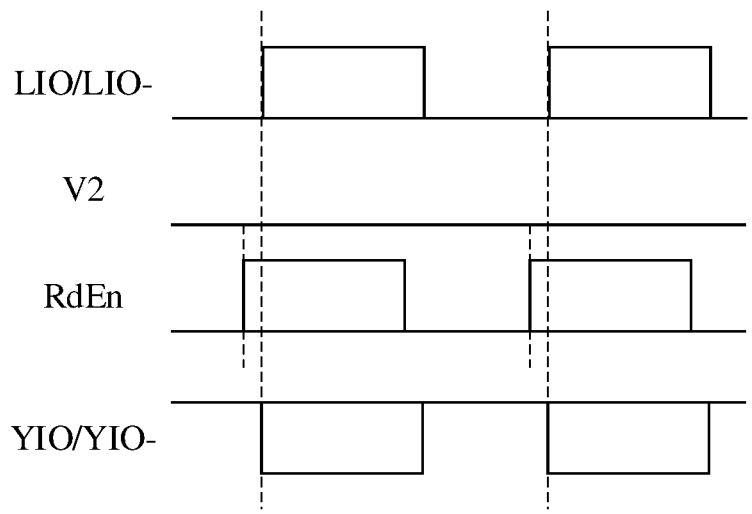
FIG. 4 is another schematic diagram of timing sequences of providing signals when data on a local data line/complementary local data is read out to a global data line/complementary global data line according to an embodiment of the present disclosure.
Figure 5:
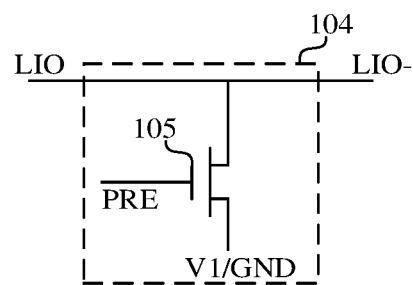
FIG. 5 is a schematic structural diagram of a precharge module according to an embodiment of the present disclosure.
Figure 6:
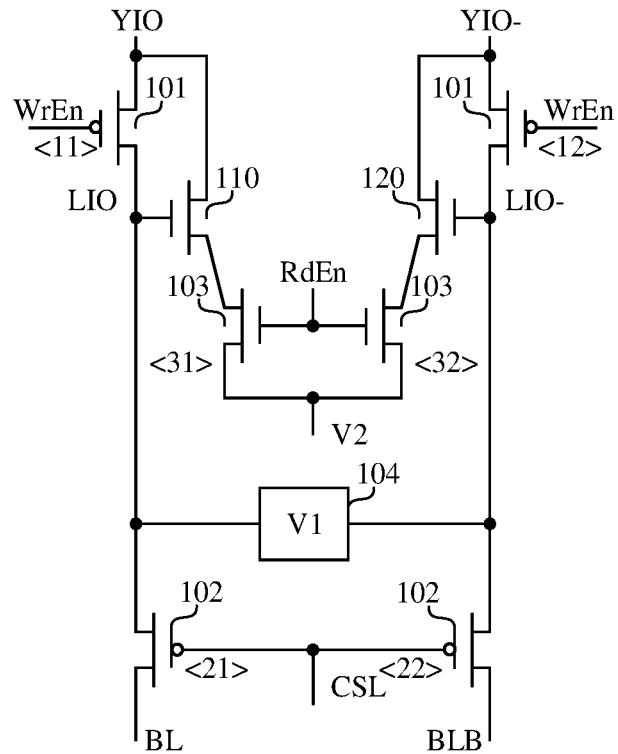
FIG. 6 is a schematic structural diagram of another local amplifying circuit according to an embodiment of the present disclosure.

FIG. 1 is a schematic structural diagram of a local amplifying circuit according to an embodiment. FIG. 2 is a schematic diagram of a timing sequence of providing a read enable signal and a column selection signal according to an embodiment. FIG. 3 and FIG. 4 are schematic diagrams of timing sequences of providing signals when data on a local data line/complementary local data line is read out to a global data line/complementary global data line according to an embodiment. FIG. 5 is a schematic structural diagram of a precharge module according to an embodiment. FIG. 6 is a schematic structural diagram of another local amplifying circuit according to an embodiment. The local amplifying circuit provided in the embodiments is further described in detail with reference to the accompanying drawings.

Referring to FIG. 1, a local amplifying circuit includes write control transistors 101, column selection transistors 102, a first control N-channel metal oxide semiconductor (NMOS) transistor 110, a second control NMOS transistor 120, a precharge module 104 and read control transistors 103.

The write control transistors 101 are configured to, based on a write enable signal WrEn, connect a global data line YIO to a local data line LIO and connect a complementary global data line YIO– to a complementary local data line LIO–.

The write enable signal WrEn is used to turn on the write control transistors 101. The global data line YIO and the complementary global data line YIO– are used to transmit inverted data, that is, the global data line YIO transmits high level data and the complementary global data line YIO– transmits low level data; and the global data line YIO transmits low level data, and the complementary global data line YIO– transmits high level data. In addition, the local data line LIO and the complementary local data line LIO– are also used to transmit inverted data.

The column selection transistors 102 are configured to, based on a column selection signal CSL, connect a bit line BL to the local data line LIO and connect a complementary bit line BLB to the complementary local data line LIO–.

The column selection signal CSL is used to turn on the column selection transistors 102. The bit line BL and the complementary bit line BLB are used to transmit inverted data, and the bit line BL and the complementary bit line BLB are connected with one or more memory cells. When the data is transmitted from the local data line LIO to the bit line BL, or the data is transmitted from the complementary local data line LIO– to the complementary bit line BLB, the memory is in a data storage phase. When the data is transmitted from the bit line BL to the local data line LIO, or the data is transmitted from the complementary bit line BLB to the complementary local data line LIO–, the memory is in a data readout phase.

A gate of the first control NMOS transistor 110 is connected to the local data line LIO, one of a source and a drain is connected to the global data line YIO and the other is connected to a read control transistor 103.

A gate of the second control NMOS transistor 120 is connected to the complementary local data line LIO–, one of a source and a drain is connected to the complementary global data line YIO– and the other is connected to a read control transistor 103.

The first control NMOS transistor 110 is controlled by a level of the local data line LIO. When the local data line LIO is at a high level, the first control NMOS transistor 110 is turned on, and one of a source and a drain of the corresponding read control transistor 103 is connected to the global data line YIO. When the local data line LIO is at a low level, the first control NMOS transistor 110 is turned off. The second control NMOS transistor 120 is controlled by a level of the complementary local data line LIO–. When the complementary local data line LIO– is at a high level, the second control NMOS transistor 120 is turned on, and one of a source and a drain of the corresponding read control transistor 103 is connected to the complementary global data line YIO–. When the complementary local data line LIO– is at a low level, the second control NMOS transistor 120 is turned off.

The precharge module 104 is connected to the local data line LIO and the complementary local data line LIO– and configured to precharge the local data line LIO and the complementary local data line LIO– to a first preset level V1. The first preset level V1 is less than a threshold voltage of the first control NMOS transistor and less than a threshold voltage of the second control NMOS transistor.

The read control transistors 103 are configured to pull up/down levels of ends, each of which is connected to a corresponding read control transistor 103, of the first control NMOS transistor and the second control NMOS transistor to a second preset level V2 based on a read enable signal RdEn. The second preset level V2 is opposite to a precharge level of the global data line YIO and the complementary global data line YIO–.

The read enable signal RdEn is used to turn on the read control transistor 103. When the first control NMOS transistor 110 and the corresponding read control transistor 103 are turned on, the read control transistor 103 pull up/down the global data line YIO to the second preset level V2, and when the second control NMOS transistor 120 and the corresponding read control transistor 103 are turned on, the read control transistor 103 pull up/down the complementary global data line YIO− to the second preset level V2. The second preset level V2 is opposite to the precharge level of the global data line YIO and the complementary global data line YIO−.

Based on the local amplifying circuit provided in the present embodiment, the local data line LIO and the complementary local data line LIO− are precharged to the first preset level V1 through the precharge module 104, and the first preset level V1 is insufficient to turn on the first control NMOS transistor 110 and the second control NMOS transistor 120. In a data writing phase, the write enable signal WrEn is provided, and the data on the global data line YIO and the complementary global data line YIO− is transmitted to the local data line LIO and the complementary local data line LIO−. Since the read control transistors 103 cannot be turned on, the turn-on of the first control NMOS transistor 110 and the second control NMOS transistor 120 does not affect the data writing of the memory. In a data readout stage, the read enable signal RdEn may be provided in advance. In such case, since the first control NMOS transistor 110 and the second control NMOS transistor 120 cannot be turned on, the data readout of the memory is not affected. After the column selection signal CSL is provided, the data of the bit line BL and the complementary bit line BLB is synchronized to the local data line LIO and the complementary local data line LIO−. The first control NMOS transistor 110 or the second control NMOS transistor 120 is turned on, so that a corresponding readout path is turned on, and the data on the local data line LIO and the complementary local data line LIO− is transmitted to the global data line YIO and the complementary global data line YIO−. Therefore, in the data readout phase, the time interval between the time of providing the column selection signal CSL and the read enable signal RdEn is shortened, and the data readout of the memory is accelerated.

It should be noted that, referring to FIG. 2, based on the local amplifying circuit provided in the present embodiment, since there is a delay of t1 from the time when the column selection signal CSL is provided to a time when changes of the local data line LIO and the complementary local data line LIO− are completed, it is only required to ensure that the read enable signal RdEn is provided prior to the completion of the changes of the local data line LIO and the complementary local data line LIO−, which may also accelerate the data readout of the memory. That is, in some embodiments, the read enable signal may be provided within the t1 time period.

In some embodiments, referring to FIG. 3, the precharge level of the global data line YIO and the complementary global data line YIO− precharged before data readout is a low level, and the second preset level V2 is a high level. In this case, the global data line YIO is pulled up to the high level when the first control NMOS transistor 110 and the corresponding read control transistor 103 are turned on, and the complementary global data line YIO− is pulled up to the high level when the second control NMOS transistor 120 and the corresponding read control transistors 103 are turned on.

In some embodiments, referring to FIG. 4, the precharge level of the global data line YIO and the complementary global data line YIO− precharged before data readout is a high level, and the second preset level V2 is a low level. In this case, the global data line YIO is pulled down to the low level when the first control NMOS transistor 110 and the corresponding read control transistor 103 are turned on, and the complementary global data line YIO− is pulled down to the low level when the second control NMOS transistor 120 and the corresponding read control transistors 103 are turned on.

In some embodiments, the first preset level is 0, i.e., the local data line LIO and the complementary local data line LIO− are discharged prior to the data readout phase or the data writing phase.

Specifically, referring to FIG. 5, the precharge module 104 includes a precharge MOS transistor 105. A gate of the precharge MOS transistor 105 is configured to receive a precharge signal PRE, one of a source and a drain is connected to the local data line LIO and the complementary local data line LIO−, the other is connected to ground GND, thereby controlling discharge of the local data line LIO and the complementary local data line LIO− through the precharge signal PRE.

In some embodiments, continuing to refer to FIG. 1, the write control transistors 101 include a first write MOS transistor <11> and a second write MOS transistor <12>.

The first write MOS transistor <11> has a gate configured to receive the write enable signal WrEn, a source connected to the global data line YIO and a drain connected to the local data line LIO.

The second write MOS transistor <12> has a gate configured to receive the write enable signal WrEn, a source connected to the complementary global data line YIO− and a drain connected to the complementary local data line LIO−.

In this embodiment, the first write MOS transistor <11> and the second write MOS transistor <12> are NMOS transistors. Since the PMOS transistor has a stronger pull-up capability than the NMOS transistor, in some embodiments, the first write MOS transistor <11> and the second write MOS transistor <12> are PMOS transistors, which may accelerate to pull up the local data line LIO or the complementary local data line LIO− to a high level after the write enable signal WrEn is provided.

In some embodiments, continuing to refer to FIG. 1, the column selection transistors 102 include a first column selection MOS transistor <21> and a second column selection MOS transistor <22>.

The first column selection MOS transistor <21> has a gate configured to receive the column selection signal CSL, a source connected to the local data line LIO and a drain connected to the bit line BL.

The second column selection MOS transistor <22> has a gate configured to receive the column selection signal CSL, a source connected to the complementary local data line LIO− and a drain connected to the complementary bit line BLB.

In this embodiment, the first column selection MOS transistor <21> and the second column selection MOS transistor <22> are NMOS transistors. Since the PMOS transistor has a stronger pull-up capability than the NMOS transistor, in some embodiments, the first column selection transistor <21> and the second column selection transistor <22> are PMOS transistors, which may accelerate to pull up the local data line LIO or the complementary local data line LIO− to a high level after the column selection signal CSL is provided.

Specifically, when the first write MOS transistor <11> and the second write MOS transistor <12> are PMOS transistors, the first column selection transistor <21> and the second column selection transistor <22> are PMOS transistors, the corresponding circuit diagram is illustrated in FIG. 6.

In some embodiments, continuing to refer to FIG. 1, the read control transistors 103 include a first read MOS transistor <31> and a second read MOS transistor <32>.

The first read MOS transistor <31> has a gate configured to receive the read enable signal RdEn, a source connected to the first control NMOS transistor 110 and a drain configured to receive the second preset level V2.

The second read MOS transistor <32> has a gate configured to receive the read enable signal RdEn, a source connected to the second control NMOS transistor 120 and a drain configured to receive the second preset level V2.

In the present embodiment, the first read MOS transistor <31> and the second read MOS transistor <32> are NMOS transistors. Since the PMOS transistor has a stronger pull up capability than the NMOS transistor, and the NMOS transistor has a stronger pull down capability than the PMOS transistor, in some embodiments, the types of the first read MOS transistor <31> and the second read MOS transistor <32> may be flexibly set according to the level of the second preset level V2. For example, when the second preset level V2 is a high level, the first read MOS transistor <31> and the second read MOS transistor <32> are NMOS transistors, and when the second preset level V2 is a low level, the first read MOS transistor <31> and the second read MOS transistor <32> are PMOS transistors.

It should be noted that, for the various MOS transistors mentioned above, the specific connection mode of "source" and "drain" does not constitute a limitation to the present embodiment. In other embodiments, the connection mode of "drain" replacing with "source" and "source" replacing "drain" can be adopted.

It should be noted that the features disclosed in the amplifying circuit provided in the above embodiments may be arbitrarily combined without collision to obtain new circuit embodiments.

Based on the local amplifying circuit provided in the present embodiment, the local data line LIO and the complementary local data line LIO− are precharged to the first preset level V1 through the precharge module 104, and the first preset level V1 is insufficient to turn on the first control NMOS transistor 110 and the second control NMOS transistor 120. In the data writing phase, the write enable signal WrEn is provided, and the data on the global data line YIO and the complementary global data line YIO− is transmitted to the local data line LIO and the complementary local data line LIO−. Since the read control transistors 103 cannot be turned on, the turn-on of the first control NMOS transistor 110 and the second control NMOS transistor 120 does not affect the data writing of the memory. In the data readout stage, the read enable signal RdEn may be provided in advance. In such case, since the first control NMOS transistor 110 and the second control NMOS transistor 120 cannot be turned on, the data readout of the memory is not affected. After the column selection signal CSL is provided, the data of the bit line BL and the complementary bit line BLB is synchronized to the local data line LIO and the complementary local data line LIO−. The first control NMOS transistor 110 or the second control NMOS transistor 120 is turned on, so that a corresponding readout path is turned on, and the data on the local data line LIO and the complementary local data line LIO− is transmitted to the global data line YIO and the complementary global data line YIO−. Therefore, in the data readout phase, the time interval between the time of providing the column selection signal CSL and the time of providing the read enable signal RdEn is shortened, and the data readout of the memory is accelerated.

Another embodiment of the present disclosure provides a data readout method. Based on the local amplifying circuit provided in the above embodiments, the time interval between the time of providing the column selection signal and the time of providing the read enable signal is shorten during a data readout phase, thereby accelerating data readout of the memory.

Figure 7:
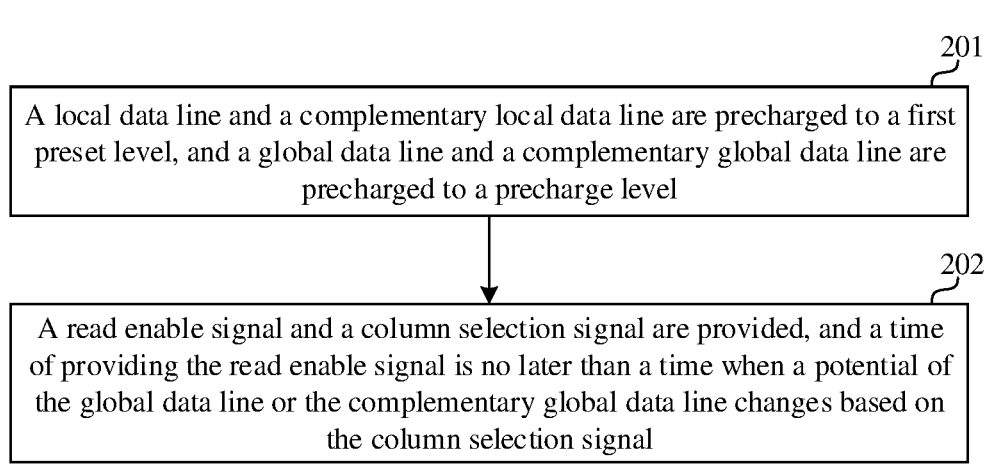
FIG. 7 is a schematic flowchart of a data readout method according to another embodiment of the present disclosure.

FIG. 7 is a schematic flowchart diagram of a data readout method according to an embodiment. The data readout method according to the present embodiment is further described in detail with reference to the accompanying drawings.

Referring to FIG. 7, the data readout method includes the following operations.

In 201, a local data line and a complementary local data line are precharged to a first preset level, and a global data line and a complementary global data line are precharged to a precharge level.

Specifically, prior to the readout phase, the local data line and the complementary local data line are precharged to the first preset level, and the global data line and the complementary global data line are precharged to the precharge level.

In 202, a read enable signal and a column selection signal are provided, and a time of providing the read enable signal is no later than a time when a potential of the global data line or the complementary global data line changes based on the column selection signal.

Specifically, during the readout phase, the read enable signal is provided to pull up/down the global data line to the second preset level responsive to that the first control NMOS transistor is turned on, and to pull up/down the complementary global data line to the second preset level responsive to that the second control NMOS transistor is turned on. A column selection signal is provided to synchronize a level of the bit line to the local data line and synchronize a level of the complementary bit line to the complementary local data line. The time when the read enable signal is provided is no later than the time when the potential of the global data line or the complementary global data line changes based on the column selection signal.

The local data line and the complementary local data line are precharged to the first preset level through the precharge module, and the first preset level is insufficient to turn on the first control NMOS transistor and the second control NMOS transistor. In the data writing phase, the write enable signal is provided, and the data on the global data line and the complementary global data line is transmitted to the local data line and the complementary local data line. Since the read control transistors cannot be turned on, the turn-on of the first control NMOS transistor and the second control NMOS transistor does not affect the data writing of the memory. In the data readout stage, the read enable signal may be provided in advance. In this case, since the first control NMOS transistor and the second control NMOS transistor cannot be turned on, the data readout of the memory is not affected. After the column selection signal is provided, the data of the bit line and the complementary bit line is synchronized to the local data line and the complementary local data line. The first control NMOS transistor or the second control NMOS transistor is turned on, so that a corresponding readout path is turned on, and the data on the local data line and the complementary local data line is transmitted to the global data line and the complementary global data line. Therefore, in the data readout phase, the time interval between the time of providing the column selection signal and the time of providing the read enable signal is shortened, and the data readout of the memory is accelerated.

Referring to FIG. 2, since there is a delay of t1 from the time of providing the column selection signal CSL to a time when changes of the local data line LIO and the complementary local data line LIO- are completed, it is only required to ensure that the read enable signal RdEn is provided prior to the completion of the changes of the local data line LIO and the complementary local data line LIO-, which may also accelerate the data readout of the memory. That is, in some embodiments, the read enable signal may be provided within the t1 time period. In some embodiments, the time of providing the read enable signal is no later than the time of providing the column selection signal. In some embodiments, the read enable signal and the column select signal are provided simultaneously.

It should be noted that the description of the above data readout method is similar to that of the above embodiments of the local amplifying circuit, and has advantages similar to those of the embodiments of the local amplifying circuit, and therefore, details are not described. Technical details not disclosed in the data readout method of the embodiment of the present disclosure are understood with reference to the description of the local amplifying circuit in the embodiments of the present disclosure.

Another embodiment of the present disclosure provides a memory, which is configured to write and readout data using the local amplifying circuit provided in the above embodiments, so as to shorten the time interval between the time of providing the column selection signal and the time of providing the read enable signal, thereby accelerating data readout of the memory.

In some embodiments, the memory is a dynamic random access memory DRAM chip.

In some embodiments, the memory is a dynamic random access memory SRAM chip.

In some embodiments, the memory is a dynamic random access memory SDRAM chip, and a memory of the dynamic random access memory DRAM chip is conformed to the double data rate (DDR) memory specification.

In some embodiments, the memory is a dynamic random access memory SDRAM chip, and a memory of the dynamic random access memory DRAM chip is conformed to the 2nd DDR (DDR2) memory specification.

In some embodiments, the memory is a dynamic random access memory SDRAM chip, and a the memory of the dynamic random access memory DRAM chip is conformed to the 3rd DDR (DDR3) memory specification.

In some embodiments, the memory is a dynamic random access memory SDRAM chip, and a memory of the dynamic random access memory DRAM chip is conformed to 4th DDR (DDR4) or 4th Low Power Double Data Rate (LPDDR4) memory specifications.

In some embodiments, the memory is a dynamic random access memory SDRAM chip, and a memory of the dynamic random access memory DRAM chip is conformed to DDR5 or LPDDR5 memory specifications.

In some embodiments, the memory is a dynamic random access memory SDRAM chip, and a memory of the dynamic random access memory DRAM chip is conformed to 5th Graphics Double Data Rate (GDDR5) or GDDR6 memory specifications.

Those of ordinary skill in the art may understand that the above embodiments are specific embodiments for implementing the present disclosure, and in practical application, various changes may be made thereto in form and detail without departing from the spirit and scope of the present disclosure.

The invention claimed is:

1. A local amplifying circuit, comprising:
   write control transistors, configured to connect, based on a write enable signal, a global data line to a local data line and a complementary global data line to a complementary local data line;
   column selection transistors, configured to connect, based on a column selection signal, a bit line to the local data line and a complementary bit line to the complementary local data line;
   a first control N-channel metal oxide semiconductor (NMOS) transistor having a gate connected to the local data line, one of a source and a drain of the first NMOS transistor being connected to the global data line and the other being connected to a corresponding read control transistor;
   a second control NMOS transistor having a gate connected to the complementary local data line, one of a source and a drain of the second control NMOS transistor being connected to the complementary global data line and the other being connected to a corresponding read control transistor; and
   a precharge module, connected to the local data line and the complementary local data line and configured to precharge the local data line and the complementary local data line to a first preset level, the first preset level being less than a threshold voltage of the first control NMOS transistor and less than a threshold voltage of the second control NMOS transistor;
   wherein the read control transistors are configured to pull up/down an end of the first control NMOS connected to the corresponding read control transistor and an end of the second control NMOS transistor connected to the corresponding read control transistor to a second preset level based on a read enable signal; and,
   wherein a time of providing the read enable signal is between a time when the column selection signal is provided and a time when a potential of the global data line or the complementary global data line changes based on the column selection signal; and
   a precharge level of the global data line and the complementary global data line is a low level when the second preset level is a high level, or the precharge level of the global data line and the complementary global data line is the high level, when the second preset level is the low level.

2. The local amplifying circuit of claim 1, wherein the first preset level is 0.

3. The local amplifying circuit of claim 2, wherein the precharge module comprises a precharge Metal-Oxide-Semiconductor (MOS) transistor, and a gate of the precharge MOS transistor is configured to receive a precharge signal, one of a source and a drain of the precharge MOS transistor is connected to the local data line and the complementary local data line and the other is connected to ground.

4. The local amplifying circuit of claim 1, wherein the precharge level of the global data line and the complementary global data line precharged before data readout is a low level and the second preset level is a high level.

5. The local amplifying circuit of claim 1, wherein the precharge level of the global data line and the complementary global data line precharged before data readout is a high level and the second preset level is a low level.

6. The local amplifying circuit of claim 1, wherein the write control transistors comprise:
   a first write MOS transistor, having a gate configured to receive the write enable signal, a source connected to the global data line and a drain connected to the local data line; and
   a second write MOS transistor, having a gate configured to receive the write enable signal, a source connected to the complementary global data line and a drain connected to the complementary local data line.

7. The local amplifying circuit of claim 6, wherein the first write MOS transistor and the second write MOS transistor are P-channel metal oxide semiconductor (PMOS) transistors.

8. The local amplifying circuit of claim 1, wherein the column selection transistors comprise:
   a first column selection MOS transistor, having a gate configured to receive the column selection signal, a source connected to the local data line and a drain connected to the bit line; and
   a second column selection MOS transistor, having a gate configured to receive the column selection signal, a source connected to the complementary local data line and a drain connected to the complementary bit line.

9. The local amplifying circuit of claim 8, wherein the first column selection MOS transistor and the second column selection MOS transistor are PMOSs.

10. The local amplifying circuit of claim 1, wherein the read control transistors comprise:
    a first read MOS transistor, having a gate configured to receive the read enable signal, a source connected to the first control NMOS transistor and a drain configured to receive the second preset level; and
    a second read MOS transistor, having a gate configured to receive the read enable signal, a source connected to the second control NMOS transistor and a drain configured to receive the second preset level.

11. A memory, configured to write and readout data using the local amplifying circuit of claim 1.

12. The memory of claim 11, wherein the memory comprises any one of dynamic random access memory (DRAM), synchronous dynamic random-access memory (SDRAM), double data rate SDRAM (DDR-SDRAM), 2nd DDR-SDRAM (DDR2-SDRAM), 3rd DDR-SDRAM (DDR3-SDRAM), 4th DDR-SDRAM (DDR4-SDRAM), 4th Low Power Double Data Rate SDRAM (LPDDR4-SDRAM), 5th DDR-SDRAM (DDR5-SDRAM), 5th LPDDR SDRAM (LPDDR5-SDRAM), 5th Graphics Double Data Rate SDRAM (GDDR5-SDRAM), and 6th GDDR-SDRAM (GDDR6-SDRAM).

13. A data readout method, applied to the local amplifying circuit of claim 1, comprising:
    precharging, prior to a readout phase, a local data line and a complementary local data line to a first preset level, and precharging a global data line and a complementary global data line to a precharge level;
    providing, during the readout phase, a read enable signal to pull up/down the global data line to a second preset level responsive to that a first control NMOS transistor is turned on, and to pull up/down the complementary global data line to the second preset level responsive to that a second control NMOS transistor is turned on; and
    providing a column selection signal to synchronize a level of a bit line to the local data line and synchronize a level of a complementary bit line to the complementary local data line; and,
    wherein a time of providing the read enable signal is between a time when the column selection signal is provided and a time when a potential of the global data line or the complementary global data line changes based on the column selection signal.

* * * * *